United States Patent
Keite-Telgenbüscher

(10) Patent No.: US 9,593,264 B2
(45) Date of Patent: Mar. 14, 2017

(54) ELECTRICALLY CONDUCTIVE HEAT-ACTIVATED ADHESIVE COMPOUND

(75) Inventor: Klaus Keite-Telgenbüscher, Hamburg (DE)

(73) Assignee: tesa SE, Norderstedt (DE)

(*) Notice: Subject to any disclaimer, the term of this patent is extended or adjusted under 35 U.S.C. 154(b) by 325 days.

(21) Appl. No.: 14/236,269

(22) PCT Filed: Jul. 10, 2012

(86) PCT No.: PCT/EP2012/063465
§ 371 (c)(1),
(2), (4) Date: Mar. 26, 2014

(87) PCT Pub. No.: WO2013/020765
PCT Pub. Date: Feb. 14, 2013

(65) Prior Publication Data
US 2014/0216644 A1  Aug. 7, 2014

(30) Foreign Application Priority Data

Aug. 10, 2011  (DE) .................. 10 2011 080 724

(51) Int. Cl.
| | |
|---|---|
| C09J 9/02 | (2006.01) |
| C09J 7/00 | (2006.01) |
| H01B 1/22 | (2006.01) |
| C09J 7/02 | (2006.01) |
| C09J 5/06 | (2006.01) |
| C09J 11/04 | (2006.01) |
| H05K 3/32 | (2006.01) |
| C08K 7/04 | (2006.01) |
| C08K 3/04 | (2006.01) |
| C08K 3/08 | (2006.01) |

(52) U.S. Cl.
CPC . *C09J 9/02* (2013.01); *C09J 5/06* (2013.01); *C09J 7/00* (2013.01); *C09J 7/0203* (2013.01); *C09J 11/04* (2013.01); *H01B 1/22* (2013.01); *C08K 3/04* (2013.01); *C08K 3/08* (2013.01); *C08K 7/04* (2013.01); *C09J 2201/602* (2013.01); *C09J 2203/326* (2013.01); *C09J 2205/102* (2013.01); *C09J 2400/22* (2013.01); *H05K 3/321* (2013.01)

(58) Field of Classification Search
CPC ..... C09J 7/00; C09J 7/0203; C09J 9/02; C09J 5/06; C09J 11/04; H01B 1/22
See application file for complete search history.

(56) References Cited

U.S. PATENT DOCUMENTS

| | | | |
|---|---|---|---|
| 4,533,685 A * | 8/1985 | Hudgin | C08K 3/08 252/512 |
| 4,882,227 A | 11/1989 | Iwase et al. | |
| 5,082,595 A | 1/1992 | Glackin | |
| 5,300,340 A | 4/1994 | Calhoun et al. | |
| 5,433,892 A | 7/1995 | Czech | |
| 5,463,190 A | 10/1995 | Carson et al. | |
| 5,494,730 A | 2/1996 | Calhoun et al. | |
| 5,554,678 A | 9/1996 | Katsumata et al. | |
| 6,013,376 A | 1/2000 | Yenni, Jr. | |
| 6,344,157 B1 | 2/2002 | Cheng et al. | |
| 6,573,322 B1 | 6/2003 | Sakakibara et al. | |
| 8,173,250 B2 | 5/2012 | Greiner et al. | |
| 8,460,969 B2 | 6/2013 | Krawinkel et al. | |
| 2005/0178496 A1* | 8/2005 | Aisenbrey | G06K 19/07749 156/244.11 |
| 2005/0282002 A1 | 12/2005 | Husemann et al. | |
| 2006/0247352 A1 | 11/2006 | Bormashenko et al. | |
| 2007/0158617 A1 | 7/2007 | Greiner et al. | |
| 2008/0196831 A1 | 8/2008 | Friese et al. | |
| 2010/0038025 A1 | 2/2010 | Keite-Telgen-Buescher et al. | |
| 2010/0068514 A1 | 3/2010 | Ellinger et al. | |
| 2011/0121356 A1 | 5/2011 | Krawinkel et al. | |
| 2012/0177930 A1 | 7/2012 | Henckens | |
| 2012/0228013 A1 | 9/2012 | Matienzo et al. | |

FOREIGN PATENT DOCUMENTS

| | | |
|---|---|---|
| CN | 1373480 A | 10/2002 |
| CN | 101495587 A | 7/2009 |
| CN | 101942287 A | 1/2011 |
| CN | 102471651 A | 5/2012 |
| DE | 10162613 A1 | 6/2003 |
| DE | 69902957 T2 | 9/2003 |
| DE | 10259549 A1 | 7/2004 |
| DE | 102004029589 A1 | 12/2005 |
| DE | 102007007617 A | 8/2008 |

(Continued)

OTHER PUBLICATIONS

International Search Report for co-pending U.S. Appl. No. 14/236,249 for related PCT Application No. PCT/EP2012/063470 dated Jan. 30, 2013.
German Search Report for co-pending U.S. Appl. No. 14/236,249 for related German Application No. 10 2011 080 729.2 dated Mar. 27, 2012.
International Search Report of corresponding PCT Application No. PCT/EP2012/063465 dated Jan. 31, 2013.
German Search Report for related German Application No. 10 2011 080 724.1 dated Mar. 27, 2012.
Chinese Office Action for corresponding CN Application No. 201280049583.6 dated Dec. 31, 2014.
Chinese Office Action for corresponding CN Application No. 201280049583.6 dated Sep. 6, 2015.
Chinese Office Action for corresponding CN Application No. 201280049384.5 dated Aug. 5, 2015.

(Continued)

*Primary Examiner* — Daniel McNally
(74) *Attorney, Agent, or Firm* — Norris McLaughlin & Marcus, P.A.

(57) ABSTRACT

An adhesive film, which can be bonded when heat-activated, comprising a) a polymer-metal blend comprising at least one adhesive which can be bonded when heat-activated, and at least one metal component melting in the temperature range from 50° C. to 400° C., and b) at least one fibrous, electrically conductive filler, the filler being present at least partly in the form of a bound fiber network with the metal component.

20 Claims, No Drawings

(56) References Cited

FOREIGN PATENT DOCUMENTS

| | | |
|---|---|---|
| DE | 102008047964 A1 | 3/2010 |
| DE | 102008060113 A1 | 7/2010 |
| EP | 0154654 A1 | 9/1985 |
| EP | 0561854 A1 | 9/1993 |
| EP | 0942436 A1 | 9/1999 |
| EP | 1475424 A1 | 11/2004 |
| EP | 1695358 A1 | 8/2006 |
| EP | 1956063 A2 | 8/2008 |
| EP | 2042580 A1 | 4/2009 |
| JP | H031388808 A | 6/1991 |
| JP | 2001291431 A | 10/2001 |
| JP | EP 1541654 A1 * | 6/2005 ........ C09J 9/02 |
| KR | 102001032872 A | 4/2001 |
| WO | 9839781 | 9/1998 |
| WO | 2005057590 A1 | 6/2005 |
| WO | 2007087281 A1 | 8/2007 |
| WO | 2008014169 A1 | 1/2008 |
| WO | 2011003948 A2 | 1/2011 |

* cited by examiner

ELECTRICALLY CONDUCTIVE HEAT-ACTIVATED ADHESIVE COMPOUND

This application is a 371 application of PCT/EP2012/063465 filed Jul. 10, 2012, which claims foreign priority benefit under 35 U.S.C. §119 of German Application No. DE 10 2011 080 724.1 filed Aug. 10, 2011.

The invention relates to electrically conductive, heat-activatable adhesives and adhesive sheets with outstanding conductivity.

For numerous applications of plastics within electronics and electrical engineering, the components employed are required to exhibit electrical and/or electromagnetic and/or thermal conductivity, for the plastics parts used as well. Nowadays there are a multiplicity of plastics compounds, admixed with conductive fillers, which cover a volume resistivity range from $10^{10}$ Ω·cm to $10^{-1}$ Ω·cm. Electrically conducting fillers used are, for example, carbon black, carbon fibers, metal particles, metal fibers, or intrinsically conductive polymers.

To impart conductivity to an insulator such as plastic, conductive pathways through the plastic are created by means of the electrically conductive fillers, meaning that, ideally, the conductive particles contact one another. It is known that a conducting network in the plastic is optimally realizable by the introduction of metal fibers or carbon fibers. In this case, the longer the fiber, the smaller the weight fraction of the fibers required for a defined conductivity. With increasing fiber length, however, processing becomes more problematic as well, because of the sharp increase in the viscosity of the compounded formulation. Compounded formulations available on the market, with a steel fiber length of 10 mm, for instance, can be processed by injection molding only up to a maximum fiber weight fraction of around 25% to 30%. Using shorter fibers, compounded formulations with higher fiber weight fractions can still be processed by injection molding, but this—by comparison with the long fiber—does not bring any reduction in the volume resistivity. Similar behavior is found for thermoplastics filled with carbon fiber and with metal particles.

Another problem is that owing to differences in coefficients of expansion, the particle or fiber network in the filled thermoplastics widens under the effect of temperature, causing interruption to the conductive pathways.

Also known art is the incorporation into polymer melts of low-melting metal alloys, involving melting of these alloys, to produce polymer-metal blends. Such blends are incorporated as injection-molded or extruded conductor tracks into electronic components.

U.S. Pat. No. 4,533,685 A, for instance, discloses polymer-metal blends which are produced by jointly melting polymer with low-melting metal alloy. Polymers described are a multiplicity of elastomers, thermoplastics, and curable polymers (thermosets), without any preferred selection being made. There is no reference in that specification to use as an adhesive. In that specification the polymer-metal blends are processed to compression moldings possessing a thickness of around 6 mm, or are injection-molded. Additionally presented is an embodiment in which a polyurethane composition is drawn to a film, with the metal domains being highly oriented, resulting only in anisotropic conductivity.

A disadvantage of these systems is the need to form a blend with a continuous metallic phase in order to achieve a high conductivity. The latter is achieved only for a metal fraction of 50 vol %. Below this fraction, lower conductivities are in fact achieved, but require the chance development of conductive pathways, meaning that the system offers no significant advantage over particle-filled systems.

Where a continuous metal phase is present, the material essentially also takes on the mechanical properties of the metal, implying, for example, a low elasticity and deformability. Under load, the metal structures easily break and the conductivity falls. The addition of metallic fillers (powders, fibers, or platelets) for the purpose of increasing the conductivity is a subject of general description, but without any concrete selection being made.

U.S. Pat. No. 4,882,227 A describes an electrically conductive resin mixture incorporating a low-melting metal alloy and also conductive fibers. The resin, however, is coated superficially onto the fiber-metal mixture and then formed into pellets. In substantial parts, therefore, the surface of the mixture is not conductive. No isotropically conductive blend structure is produced.

The polymers used therein are typical engineering thermoplastics which the skilled person in this context would not consider for the production of adhesives.

There is disclosure, furthermore, to the effect that in the resin described, the fraction of conductive fibers must not exceed 30 wt %, since otherwise the fluidity and hence the processing qualities of the resin would be severely degraded. This limits the attainable conductivity.

Only in a second step are the pellets produced incorporated as a masterbatch into a polymer melt of one of the abovementioned polymers, and dispersed. The further "dilution" of the conductive components reduces the overall conductivity, meaning that application is viewed in the EMI shielding segment (shielding against electromagnetic interference), where a conductivity in the range from $10^{-2}$ to $10^{2}$ S/cm is sufficient.

U.S. Pat. No. 5,554,678 A likewise describes a composition which is sufficiently conductive for shielding purposes and comprises metal fibers, a low-melting metal alloy, and carbon fibers additionally. Here again, the polymer basis stated comprises typical engineering thermoplastics which the skilled person would not consider for the production of adhesives. First of all, again, a masterbatch is produced and pelletized. Further processing is preferably by injection molding. Also described is processing by injection molding to form sheets, with subsequent shaping.

EP 942 436 B1 discloses an electrically conducting resin compound comprising a zinc-based metal powder, a low-melting metal (selected from the group consisting of tin and of tin-metal alloys which are melted at the time of a shaping operation), and a synthetic resin material. Here, in comparison to the specifications described above, the metal fibers are replaced by particles. This is preferable in order to improve the flow properties and hence the capacity for processing by injection molding. Here again, the resin compound is first of all pelletized, before being processed further by injection molding. In this connection, the skilled person would not employ this specification for the purpose of producing electrically conductive adhesives. There is no reference to adhesive properties. The resins are used exclusively for the production of moldings.

EP 1 695 358 B1 proposes a metal-plastic hybrid which comprises a thermoplastic, a lead-free metal compound melting in the range between 100° C. and 400° C., in an amount of 20 to 50 wt %, and copper fibers, in an amount of 30 to 70 wt %.

As its thermoplastic component, the metal/plastic hybrid comprises commodity plastics such as a polystyrene (PS) or polypropylene (PP), engineering thermoplastics such as polyamide (PA) or polybutylene terephthalate (PBT), or high-temperature thermoplastics. Blends or thermoplastic elastomers are also specified. There is no reference to adhesives. The hybrids are used for producing moldings by injection molding.

Electrically conductive heat-activatable adhesives are known fundamentally.

Thus, in the case of isotropically electrically conductive heat-activatable adhesives, their conductivity is produced by filling them with an electrically conductive filler. The level of filling in this case is selected such that filler percolation occurs—that is, conductive pathways for the electrical current are produced as a result of a small distance between the filler particles, or through direct contact. An example of this principle is described by DE 10 2007 007 617 A.

In the case of anisotropically conductive heat-activatable adhesive sheets, the surface conductivity is prevented by various measures, leaving generally only a conductivity perpendicular to the surface. A principle of this kind is shown in DE 10 2004 029 589 A, for example. Widespread is the filling of the adhesive with a filler whose particle diameter is larger than the layer thickness of the sheet, with the level of filling remaining below the percolation threshold.

Another class of heat-activatable conductive adhesive sheets is conductive only at the surface, but not perpendicular to the surface. This is achieved by the insertion of a conductive layer between layers of nonconductive adhesive.

Especially in the case of isotropically conductive heat-activatable adhesives, it is difficult to attain sufficiently high conductivity in conjunction with high bonding performance, since increasing level of filling lowers the active bonding area that is available. One commonplace concept, therefore, is to minimize the required level of filling through skilful selection of a suitable filler or a combination of fillers. For this purpose, for example, highly conductive metals such as silver, copper, or gold, and also forms of electrically conductive fillers that are varied in terms of their aspect ratio, such as fibers or platelets (including those on a micrometer or nanometer scale) for example, are used. Particularly noteworthy here are silver fibers, copper fibers, silver-coated mica flakes, or phyllosilicates, and also carbon nanotubes and graphene.

The existing systems of conductive heat-activatable adhesives thus require a compromise between electrical conductivity properties and adhesive properties. It was an object of the invention, therefore, to provide a heat-activatable adhesive film which has substantially isotropic conductivity, and which unites high bond strength with high electrical conductivity.

The achievement of this object has been found through an adhesive film which can be bonded when heat-activated and which comprises at least one polymer-metal blend and at least one—more particularly fibrous—electrically conductive filler. In accordance with the invention, the polymer-metal blend in turn comprises at least one adhesive which can be bonded when heat-activated and which more particularly may be an adhesive as known per se from the prior art, and also at least one metal component melting in the temperature range from 50° C. to 400° C. The filler here is present at least partially in the form of a bound fiber network with the metal component.

"Metal component melting in the temperature range from 50° C. to 400° C." means that for metal components with a melting point, the melting point is within the stated range, and for metal components—more particularly metal alloys—a melting range, the lower limit of this melting range is greater than or equal to 50° C. and the upper limit of this melting range is less than or equal to 400° C. The figures for melting points and limits of the melting range of the metal components relate to the dynamic measurement in accordance with DIN 51004 with a heating rate of 10° C./min.

"Bound fiber network" means more particularly that the fibers are present in a form bound to one another by the metal and are not merely present in mechanical contact with one another. In particular, individual sections of the fibers may be bound, by melting, for example, into different regions of the metallic phase, meaning that continuous conduction pathways are present.

Surprisingly it has been possible in this way to produce heat-activatable adhesive films which for a low level of filling permit high conductivity and high bond strength.

One advantage of the invention is that the fibers are contacted with one another by the metal compound present, and therefore high conductivities are achieved even for comparatively low levels of filling. Moreover, the described synergistic effect means that high bond strengths are achieved even when levels of filling are high.

Adhesives which can be bonded when heat-activated (identified hereinafter in more abbreviated form, but with the same meaning, as "heat-activatable adhesives" as well) are adhesives which are activated by supply of thermal energy (generally on exceedance of a defined activation temperature) and are applied in particular in this state for the application. As far as the adhesive bonding being brought about is concerned, a distinction can be made between two systems: thermoplastic heat-activatable adhesive systems (hotmelt adhesives) set physically on cooling (generally reversibly), whereas reactive heat-activatable adhesive systems (reactive systems) set chemically (generally irreversibly). There are also hybrid systems, these being adhesives which can be assigned to both categories, namely reactive thermoplastic heat-activatedly bonding adhesives (reactive hotmelt adhesives).

The activation temperature of the heat-activatable adhesives can be determined by DSC measurement, with the activation temperature of thermoplastic systems being regarded as the melting point, i.e., the temperature $T_{MP}$ of the peak extreme value in the melting procedure (measurement by means of differential scanning calorimetry (DSC) according to DIN 53765:1994-03 on a 50 g sample, heating rate 10° C./min) and, for reactive systems, as the temperature $T_{RP}$ of the peak extreme value of the corresponding curing reaction (measurement by means of differential scanning calorimetry (DSC) according to DIN 53765:1994-03 on a 50 g sample, heating rate 10° C./min).

Heat-activatable adhesives may have a certain inherent tack at room temperature, though this is not necessary for the purpose of bringing about adhesive bonding.

Thermoplastic adhesives are based on polymers which soften reversibly on heating and solidify again in the course of cooling. In contrast to these, reactive heat-activatedly bonding adhesives comprise reactive components. The latter constituents are also referred to as "reactive resins", in which heating initiates a curing process which, after the end of the curing reaction, ensures a permanent stable bond even under pressure. Frequently, therefore, so-called hardeners or curing agents are present, which are able to react with the reactive resins. Heat-activatable adhesives of this kind preferably also comprise elastic components, examples being synthetic nitrile rubbers. Such elastic components give the heat-activatedly bonding adhesive a particularly high dimensional stability even under pressure upon application, on account of their high flow viscosity.

As a heat-activatable adhesive for the adhesive film of the invention it is possible in principle to employ all systems of heat-activatable adhesives, in other words thermoplastic heat-activatable systems, reactive systems, and hybrid systems. In particular it is also possible to employ those systems which have no inherent tack at room temperature. Where systems are selected which do possess an inherent tack at room temperature and/or below the activation temperature, prepositioning of the adhesive film on the substrate surface to be bonded may be performed, for example, before the actual bonding, through the activation of the heat-activatable adhesive.

Described below, purely by way of example—and without wishing to be subject to any restriction in the teaching of the invention—are a number of typical systems of heat-activatedly bonding adhesives which have emerged as being particularly advantageous in connection with the present invention.

A thermoplastic heat-activatedly bonding adhesive, then, comprises a thermoplastic base polymer. This polymer has good flow behavior even under low applied pressure, and so the ultimate bond strength that is relevant for the durability of a permanent bond comes about within a short applied-pressure time, and, therefore, rapid bonding is possible even to a rough or otherwise critical substrate. As thermoplastic heat-activatedly bonding adhesives it is possible to use all of the thermoplastic adhesives known from the prior art.

Exemplary compositions are described in EP 1 475 424 A1, for instance. Hence the thermoplastic adhesive may comprise or even consist of, for example, one or more of the following components: polyolefins and copolymers thereof, as for example ethylene-vinyl acetate copolymers, ethylene-ethyl acrylate copolymers, polyamides and copolymers thereof, polyesters and copolymers thereof, polyurethanes, or styrene block copolymers. Employed preferably are, for instance, the thermoplastic adhesives listed in paragraph of EP 1 475 424 A1. Other thermoplastic adhesives, particularly suitable for specific fields of use such as the bonding of glass bond substrates, for example, are described in EP 1 95 60 63 A2. Preference is given to using thermoplastic adhesives whose melt viscosity has been raised by rheological additives, as for example by addition of fumed silicas, carbon black, carbon nanotubes and/or other polymers as blend components. In a synergistic way, this viscosity-increasing function is also taken on by the filler of the invention.

A reactive heat-activatedly bonding adhesive, in contrast, advantageously comprises an elastomeric base polymer and a modifier resin, the modifier resin comprising a tackifier resin and/or a reactive resin. Through the use of an elastomeric base polymer it is possible to obtain adhesive layers having outstanding dimensional stability. As reactive heat-activatedly bonding adhesives it is possible, in line with the specific applications in each case, to use all of the heat-activatedly bonded adhesives known from the prior art.

Also included here, for example, are reactive heat-activatedly bonding sheets based on nitrile rubbers or derivatives thereof such as, for instance, nitrile-butadiene rubbers or mixtures (blends) of these base polymers, additionally comprising reactive resins such as phenolic resins, for instance; one such product is available, for instance, commercially under the tesa 8401 designation. On account of its high flow viscosity, the nitrile rubber endows the heat-activatably bonding sheet with a pronounced dimensional stability, allowing high bond strength to be realized on plastics surfaces after a crosslinking reaction has been carried out.

Furthermore, it is also possible for other reactive heat-activatedly bonding adhesives to be used, such as, for instance, adhesives which comprise a mass fraction of 50 to 95 wt % of a bondable polymer and a mass fraction of 5 to 50 wt % of an epoxy resin or mixture of two or more epoxy resins. The bondable polymer in this case comprises advantageously 40 to 94 wt % of acrylic acid compounds and/or methacrylic acid compounds of the general formula $CH_2$=C($R^1$)($COOR^2$) ($R^1$ here represents a radical selected from the group encompassing H and $CH_3$, and $R^2$ represents a radical selected from the group encompassing H and linear or branched alkyl chains having 1 to 30 carbon atoms), 5 to 30 wt % of a first copolymerizable vinyl monomer which has at least one acid group, more particularly a carboxylic acid group and/or sulfonic acid group and/or phosphonic acid group, 1 to 10 wt % of a second copolymerizable vinyl monomer which has at least one epoxide group or an acid anhydride function, and 0 to 20 wt % of a third copolymerizable vinyl monomer which has at least one functional group which differs from the functional group of the first copolymerizable vinyl monomer and from the functional group of the second copolymerizable vinyl monomer. An adhesive of this kind allows bonding with rapid activation, the ultimate bond strength being achieved within just a very short time, with the result, overall, that an effectively adhering connection to a nonpolar substrate is ensured.

A further reactive heat-activatedly bonding adhesive which can be used, and which affords particular advantages, comprises 40 to 98 wt % of an acrylate-containing block copolymer, 2 to 50 wt % of a resin component, and 0 to 10 wt % of a hardener component. The resin component comprises one or more resins selected from the group encompassing bond strength-enhancing (tackifying) epoxy resins, novolak resins, and phenolic resins. The hardener component is used for crosslinking the resins from the resin component. On account of the strong physical crosslinking within the polymer, a formulation of this kind affords the particular advantage that adhesive layers having a greater overall thickness can be obtained, without detriment overall to the robustness of the bond. As a result, these adhesive layers are particularly suitable for compensating unevennesses in the substrate. Moreover, an adhesive of this kind features good aging resistance and exhibits only a low level of outgassing behavior, a particularly desirable feature for many bonds in the electronics segment.

The selection of the heat-activatable adhesive in interaction with the metal component may be made, particularly with regard to the desired application and the bonding method that is being used, such that the activation temperature of the heat-activatable adhesive is above the melting temperature of the low-melting metal component—or above the upper limit of this melting range in the case of metal components having such a melting range—or such that the activation temperature of the heat-activatable adhesive is below the melting temperature of the low-melting metal component—or below the lower limit of this melting range, for metal components having such a melting range. Of course, this is not intended to rule out the activation temperature of the heat-activatable adhesive and the melting temperature of the low-melting metal component being the very same, or, for metal components having a melting range, does not rule out the activation temperature being within the melting range of the metal component.

Generally speaking, heat-activatable adhesives with a water vapor permeation of less than 50 $g/m^2$ d (determined in accordance with ASTM F-1249 at 38° C. and 90% relative humidity for a layer thickness of 50 μm) are preferred for reducing corrosion-related conductivity losses.

Additionally preferred are heat-activatable adhesives with a water content of less than 5000 ppm, more particularly less than 1000 ppm, determined after 72 h of conditioning at 23° C. and 50% relative humidity by means of Karl Fischer titration (baking temperature 150° C.). Such heat-activatable adhesives can be found, for example, in the form of polyolefinic hotmelt adhesives.

As a low-melting metal component, low-melting metals may be used, such as, for example, zinc, tin, or else, in principle, lead. With preference in accordance with the invention in particular, however, use may be made of low-melting metal alloys. The metal component comprises essentially one or more metals, but may also include any desired adjuvants, including in particular nonmetallic adjuvants and additives.

A low-melting metal alloy is a metallic compound whose melting point or melting range lies between 50° C. and 400° C., preferably between 100° C. and 300° C. Not only low-melting metal alloys with a melting range but also those with a melting point may be used in accordance with the invention.

A feature of the low-melting metal alloy with melting point is an immediate and drastic drop in viscosity to <50 mPa·s when the melting point is exceeded. This extremely low, almost waterlike viscosity makes a decisive contribution in the compounded formulation to the high flow capacity in the case of high filling levels of filler. In the case of a low-melting metal alloy (solder compound) with a melting range, the viscosity drops continuously within the melting range and reaches a value <50 mPa·s only after the melting range has been exceeded. In accordance with the invention it is possible to use not only low-melting metal compounds having a melting point but also those having a melting range. Preferred are metal alloys with a melting range, since the broader temperature range of solidification results in a rheological behavior more similar to the adhesive, thereby facilitating the extrusion of thin sheets, and especially their stretching in the extrusion operation. Metal alloys of these kinds with a broad melting range are generally found in the hyper- or hypoeutectic mixing range of the alloy.

Preferred on the other hand are eutectic alloys, since in this case separation phenomena are reduced and there are fewer instances of adhesion to the surfaces of the compounding and shaping tools.

Preference is given to the use of low-melting metal compounds which are free from heavy metal, more particularly those which are lead-free, and are thus unobjectionable from the standpoint of toxicology. Low-melting metal compounds employed by way of example also at least include tin, zinc and/or bismuth.

Depending on what the requirement is, the fractions of low-melting metal alloy and electrically conductive fillers may be varied within a wide range, generally in sum total between 10 to 99 wt %, more particularly between 30 and 95 wt % and between 40 and 90 wt %. For attainment of the maximum conductivity it has been found that the fraction of the low-melting metal alloy ought to be between 20 and 60 wt %, advantageously between 25 and 40 wt %, and with more particular preference between 27 and 35 wt %. The fraction of conductive filler(s) is preferably between 20 and 80 wt %, with more particular preference between 30 and 70 wt %, and with more particular preference between 35 and 65 wt %.

In this way it is possible to achieve volume resistivities of <$10^{-3}$ Ωcm. It is also readily possible to attain high thermal conductivities >0.5 W/mK. The conductivity requirements (electrical/thermal) are guided by the field of use for the adhesive film, and may vary within wide limits. The statement of the conductivities is not, however, intended to confine the invention in any way.

As electrically conducting filler it is possible to use all customary and suitable materials, as for instance aluminum, copper, silver, gold, nickel, mu-metal, alnico, permalloy, ferrite, carbon nanotubes, graphene, and the like. This electrically conducting filler favorably has an electrical conductivity of more than 20 MS/m (corresponding to a resistivity of less than 50 mΩmm$^2$/m), more particularly of more than 40 MS/m (corresponding to a resistivity of less than 25 mΩ·mm$^2$/m), in each case determined for 300 K.

Preferred is the use of copper and nickel, which may also be present only as a coating on the surface of other materials. These metals display better compatibility with the low-melting metal alloys used, thereby improving the electrical contact. Especially preferred are coppered or nickeled aluminum fibers which as well as their high conductivity and the high compatibility resulting from the surface coating, also afford the advantage of a low weight. Such fibers are available, for example, from IKI Global Inc., Korea. Further preferred are copper-coated or nickel-coated carbon fibers, as available, for example, from Sulzer-Metco, Switzerland, under the E-Fill tradename.

The filler is considered fibrous when the aspect ratio, this being the ratio between greatest longitudinal extent and, orthogonally with respect to the latter, smallest longitudinal extent, is at least 3, preferably at least 10.

For a dense and therefore rigid network which presents a high resistance to deformation in the case of heat-activated bonding and which therefore allows the application of high contacting forces, a fiber length of between 0.1 and 0.9 mm is preferred.

For a loose and hence elastic network, which makes the adhesive film flexible and therefore allows improvements in appliability and in adaptation to curved substrates, a length of the fiber in the range from 1 to 10 mm is preferred.

Depending on application, it is also advantageous to use a mixture of at least two electrically conductive fillers, with at least one of the electrically conductive fillers being fibrous, although two or more of the electrically conductive fillers, and more particularly all electrically conductive fillers, may also be fibrous.

Besides the ingredients of the adhesive film which are described, further additives may also be admixed which provide a beneficial influence on the preparation of the compounded formulation or its properties. These additives may be for example, but not conclusively, dispersing additives, flow assistants, such as waxes or silicones, for example, compatibility improvers, adhesion promoters, wetting agents, solder fluxes, or intrinsically conductive polymers.

The adhesive film may be produced in a variety of ways of producing adhesive films, these ways being familiar to the skilled person. Preference is given to the production of a compounded formulation in melt form, composed of heat-activatable adhesive, filler, and metal alloy. The compounded formulation is advantageously produced and processed at a temperature at which both the low-melting metallic alloy and the adhesive are present in the liquid melt state.

In order to prevent excessive increase in the viscosity, it is possible to add viscosity-lowering adjuvants, such as waxes, for example.

The compounded formulation can be produced either discontinuously—in a compounder for example—or else continuously—in an extruder, for example, especially advantageously in a twin-screw extruder or in a continuous compounder, as for example from Buss (Pratteln, Switzerland).

The adhesive film may be produced from the compounded formulation by means, for example, of, coating, extruding, rolling, pressing, or stretching.

The adhesive film advantageously has a thickness of the kind customary in the field of heat-activatable adhesive films, in other words approximately between 1 μm and 1000 μm.

A thickness of 10 to 50 μm is preferred if the conductivity within the plane of the adhesive film is less significant to the application. In this way a saving can be made on material, and the length of the distance to be conductively bridged by the adhesive film can be kept low.

If the conductivity within the plane is highly important, then an adhesive film thickness of 200 to 500 μm is preferred, since in this way a greater cross-sectional area and hence a higher conductivity are provided. A preferred compromise between both extremes is a thickness of 50 to 200 μm.

The adhesive film may additionally be lined on one or both sides with a release liner.

In one particular embodiment, the adhesive film may be provided with a complete or perforated electrically conductive layer. This layer may be disposed on at least one side of the adhesive film, or within the adhesive film, meaning that heat-activatable adhesive film is located on both sides of the electrically conductive layer. Such a layer advantageously raises the conductivity of the adhesive film within the plane.

All customary and suitable materials can be used as an electrically conducting layer, for instance aluminum, copper, silver, gold, nickel, mu-metal, alnico, permalloy, ferrite, carbon nanotubes, graphene, intrinsically conducting polymers, indium tin oxide, and the like. This electrically conducting layer advantageously has an electrical conductivity of more than 20 MS/m (corresponding to a resistivity of less than 50 mΩ·mm$^2$/m), more particularly of more than 40 MS/m (corresponding to a resistivity of less than 25 mΩ·mm$^2$/m), in each case determined for 300 K.

The layer is advantageously in a perforated form, for instance as punched lattice, wire mesh, expanded metal, or nonwoven web, or in the form of a pattern printed or deposited by other conventional techniques, including vacuum techniques such as vapor deposition.

The shape of the heat-activatable adhesive film may be that of a web or sheet. This form may more particularly be adapted to the geometry of the bond area, such that the adhesive film takes the form, for instance, of a film cut to size and shape or of a diecut. This means more particularly that the form corresponds approximately or exactly to the shape of the joining areas of the components to be joined, and hence to the lateral form of the bonded joint. With sheetlike elements of these kinds, the dimensional stability and bond strength requirements are typically particularly high.

For applications where there is no requirement for isotropic conductivity, it is advantageous to align the fibers and/or the regions formed by the metal alloy (e.g., particles) in accordance with the desired preferential direction. This may be achieved, for example, by carrying out stretching when extruding adhesive films of the invention. The result is a greater conductivity in the plane of the heat-activatable adhesive film. When magnetic fibers are used, made from nickel or nickel-coated materials, for example, it is possible with particular advantage to align the fibers by means of a magnetic field during the thermal activation process. As a result of the reduced viscosity, such orientation can take place in this process and is fixed after the activation has ended. Particularly advantageous is orientation substantially perpendicular to the plane of the adhesive film, since by this means the contacting of the substrates to be bonded is improved. The required magnets can easily be incorporated for this purpose into the tooling of a bonding press. Particularly advantageous for these processes is the use of magnetically coated carbon fibers, since their high stiffness makes them easier to orient.

The invention further provides a method for bonding an adhesive film on a substrate surface, and also a method for bonding two substrate faces to one another (which may be assigned to two different adherends, but may also belong to a single adherend with surfaces to be bonded that are disposed accordingly) by means of an adhesive film. With these methods, in each case, the bond is produced by means of an adhesive film which can be bonded when heat-activated and which comprises at least one polymer-metal blend and at least one fibrous electrically conductive filler, the polymer-metal blend in turn comprising at least one adhesive film which can be bonded when heat-activated and also at least one metal component melting in the temperature range from 50° C. to 400° C., and the filler being present at least partly in the hybrid with the metal component.

The adhesive film here is more particularly such an adhesive film as described in this specification and/or as apparent from any of the claims.

Preferably, use is made of a method for bonding the heat-activatable adhesive film in which the activation is performed at a temperature above the melting temperature of the metal alloy (in which, therefore, the activation temperature of the heat-activatable adhesive is situated above the melting temperature of the low-melting metal component. Through the low-melting metal component, surprisingly, during the heat activation, a solderlike contact is produced with the substrate to be contacted, this contact considerably improving the electrical transition, in comparison to particles merely touching one another, and also making a synergistic contribution to the strength of the bond, so that a strength is achieved which is above the bond strength anticipated on the basis of the wetting area of the heat-activatable adhesive.

If it is possible or intended for no solderlike connection to come about between the metal compound and the substrate to be contacted, then it is advantageous to select an activation temperature of the heat-activatable adhesive that is below the melting temperature of the metal component. In the case of heat-activated joining with application of an applied pressure force, the fiber network is then elastically and/or plastically compressed and thus brought into intimate contact with the substrate. In contrast to conductive fillers which are present merely in distribution within the adhesive, and which flow during the process of joining with the softening polymer matrix, the network is deformed and in this way a contacting pressure is developed that leads to improved and more permanent contacting of the substrate.

In another advantageous method, a preliminary assembly of the adhesive film with one of the adherends is formed first of all. For this purpose, the adhesive film is brought into contact with the surface of the adherend to be bonded and advantageously only heat activation up to below the melting temperature of the metal alloy is used. In this way it is possible to carry out preliminary fixing of a preshaped adhesive tape section on an adherend part, for example. Not until this final bonding to the adherend—or between the two adherends to be bonded—is heat activation then used that is above the melting temperature of the metal alloy, resulting in the full strength and electrical conductivity of the bond.

The article of the invention and the methods are employed preferably for the bonding of construction units of electronic appliances, such as, for instance, those from the area of consumer goods electronics, entertainment electronics, or communication electronics (for example, for cellphones, PDAs, laptops and other computers, digital cameras and display devices such as displays, digital readers, or organic light-emitting diode displays (OLEDs)), and also for solar cell modules (such as, for instance, silicon solar cells, electrochemical dye solar cells, organic solar cells or thin-layer cells), or electrochemical cells, such as electrolysis cells or fuel cells, for example. Assembly units are understood presently to include all constituents and collections thereof that are used in electronic appliances, examples being electronic components (discrete and integrated components), housing parts, electronic modules, antennas, display fields, protective plates, unpopulated and/or populated circuit boards, and the like.

EXAMPLES

For adhesive bonds with the sheetlike element of the invention, two 1.5 mm-thick brass plates were bonded to one another by means of an adhesive film 100 μm thick in a Bürkle heating press, under a pressure of 0.2 MPa and at the activation temperature specified in each example. The activation time was selected in each case so that melting the adhesive film could be observed, but without any excessive squeezing-out from the adhesive joint.

The parameter determined for the quality of the adhesive bond produced was the bond strength of the resultant assembly, for different heat-activatedly bondable sheetlike elements and different process parameters. For this purpose, the bond strength was determined quantitatively in a dynamic tensile shear test in accordance with DIN 53283 at 23° C. for a test velocity of 1 mm/min in each case (results in $N/cm^2$). The result reported is the average value from three measurements.

In order to measure the electrical conductivity, during bonding, brass foils 50 μm thick were used instead of the brass plate and circular test specimens were prepared from the resultant adhesive bond, having an area of 6.45 $cm^2$. The volume resistance was measured at room temperature (23° C.) and 50% relative humidity by analogy with ASTM D 2739, with an electrode pressing pressure of 76 kPa. The average value from three measurements is reported.

Heat-activatable adhesives used were as follows:
Adhesive 1: Grilltex 1365 (copolyester) from Ems-Chemie
Adhesive 2: Amplify EA 100 (ethylene copolymer) from Dow Chemical
Adhesive 3: Irostic 8304 HV (thermoplastic polyurethane) from Huntsman
Adhesive 4: Yparex 8102E (ethylene copolymer) from DSM
Adhesive 5: Platamid 2395 (copolyamide) from Arkema
Fibrous fillers used were as follows:
Fiber 1: copper fiber F08 (0.8 mm long, 60 μm thick) from Deutsches Metallfaserwerk, Neidenstein
Fiber 2: copper fiber F3 (3 mm long, 180 μm thick) from Deutsches Metallfaserwerk, Neidenstein
Low-melting metal alloys used were as follows:
Metal 1: MCP 200 (melting point 199° C.) from HEK, Lübeck
Metal 2: MCP 62 (melting point 60° C.) from HEK, Lübeck
Metal 3: MCP 150 (melting range 138-170° C.) from HEK, Lübeck The following compounded formulations were produced (quantity figures in wt %):

| Example | Adhesive [wt %] | | | | | Fiber [wt %] | | Metal [wt %] | | |
|---|---|---|---|---|---|---|---|---|---|---|
|  | 1 | 2 | 3 | 4 | 5 | 1 | 2 | 1 | 2 | 3 |
| 1 | 40 |  |  |  |  | 20 |  | 40 |  |  |
| 2 | 20 |  |  |  |  | 20 |  | 60 |  |  |
| 3 | 25 |  |  |  |  | 35 |  | 40 |  |  |
| 4 | 5 |  |  |  |  | 35 |  | 60 |  |  |
| 5 | 32.5 |  |  |  |  | 27.5 |  | 40 |  |  |
| 6 | 12.5 |  |  |  |  | 27.5 |  | 60 |  |  |
| 7 | 30 |  |  |  |  | 20 |  | 50 |  |  |
| 8 | 15 |  |  |  |  | 35 |  | 50 |  |  |
| 9 | 22.5 |  |  |  |  | 27.5 |  | 50 |  |  |
| 10 | 15 |  |  |  |  | 40 |  | 45 |  |  |
| 11 | 15 |  |  |  |  | 45 |  | 40 |  |  |
| 12 | 15 |  |  |  |  | 50 |  | 35 |  |  |
| 13 |  | 15 |  |  |  | 40 |  | 45 |  |  |
| 14 |  |  | 15 |  |  | 40 |  | 45 |  |  |
| 15 |  |  |  | 15 |  | 40 |  | 45 |  |  |
| 16 |  |  |  |  | 15 | 40 |  | 45 |  |  |
| 17 | 15 |  |  |  |  |  | 40 | 45 |  |  |
| 18 | 15 |  |  |  |  |  | 45 | 40 |  |  |
| 19 | 15 |  |  |  |  |  | 35 | 50 |  |  |
| 20 | 15 |  |  |  |  | 40 |  |  | 45 |  |
| 21 | 15 |  |  |  |  | 40 |  |  |  | 45 |
| C1 | 15 |  |  |  |  | 85 |  |  |  |  |
| C2 | 15 |  |  |  |  |  |  | 85 |  |  |

The compounded formulations were produced using a ZSK25 corotating twin-screw extruder from Coperion with an L/d ratio of 40. The temperature regime was selected in each case to bring about complete melting of adhesive and metal alloy. In a first process zone, a blend of adhesive and metal alloy was produced, to which the metal fibers were added in a second process zone. For the shaping of the adhesive film of the invention, a flat film die was flanged directly onto the extruder, and a flat film with a thickness of 200 μm was extruded.

Surprisingly it transpired that the fiber fractions processable in the extrusion process were substantially higher than those known in the prior art.

Comparative example 1 was produced, as a deviation, in a recording compounder from Haake, since the corresponding formulation was no longer extrudable. The compounded formulation produced in this way was used to produce compression moldings with a thickness of 200 μm in a Laufer vacuum press.

The bond strengths and the electrical conductivities as well are set out in the table below:

| Example | Activation temperature [° C.] | Bond strength [$N/cm^2$] | Volume resistance [$\Omega$ cm] |
|---|---|---|---|
| 1 | 130 | 452 | 2.92E−02 |
| 2 | 130 | 286 | 2.38E−03 |
| 3 | 130 | 291 | 2.36E−03 |
| 4 | 130 | 181 | 1.21E−05 |
| 5 | 130 | 409 | 9.70E−05 |
| 6 | 130 | 226 | 3.31E−04 |
| 7 | 130 | 375 | 9.74E−03 |
| 8 | 130 | 286 | 3.29E−04 |

-continued

| Example | Activation temperature [° C.] | Bond strength [N/cm²] | Volume resistance [Ω cm] |
|---|---|---|---|
| 9 | 130 | 320 | 2.37E−03 |
| 10 | 130 | 289 | 2.15E−04 |
| 11 | 130 | 299 | 1.35E−04 |
| 12 | 130 | 294 | 3.34E−04 |
| 13 | 110 | 245 | 1.02E−04 |
| 14 | 150 | 239 | 3.82E−04 |
| 15 | 150 | 252 | 8.91E−04 |
| 16 | 130 | 545 | 1.37E−04 |
| 17 | 130 | 312 | 1.20E−03 |
| 18 | 130 | 325 | 3.01E−03 |
| 19 | 130 | 310 | 9.64E−04 |
| 20 | 130 | 433 | 4.15E−04 |
| 21 | 130 | 342 | 9.98E−04* |
| 21a | 170 | 417 | 3.27E−04 |
| C1 | 130 | 331 | 7.26E−1 |
| C2 | 110 | 228 | 1.55E−1 |

*smooth sheet surface

The examples show that the adhesive films of the invention with bound fiber network exhibit significantly increased conductivities as compared with the comparative examples, which are merely filled with fibers or particles. The effect can be observed for different adhesive polymers.

Keeping overall solids content the same while increasing the fiber fraction tends to result in higher conductivities and slightly increased bond strengths, this being attributed to the higher conductivity of the fibers and to the greater flexibility of the network.

If the content of the low-melting metal alloy is lower, the conductivity decreases again, presumably since the development of the network of fibers and regions of the metallic phase decreases (example 12).

Longer fibers lower the conductivity, this being attributed to the greater orientation into the plane of the extruded film. The conclusion from this is an increase in the conductivity in the plane (examples 17-19).

A loss of conductivity is associated with the metal alloys which melt at lower temperatures, but it is attributed exclusively to the lower conductivity of these alloys themselves.

In examples 20 and 21, where the low-melting metal alloy melts at the activation temperature, the synergistic effect occurs of the simultaneous increase in strength of the bond and increase in conductivity. This is attributed to improved contacting of the substrate material.

The invention claimed is:

1. An adhesive film, bondable when heat-activated, comprising
 a) a polymer-metal blend comprising
  at least one adhesive, bondable when heat-activated, and
  at least one metal component meltable in the temperature range from 50° C. to 400° C., and
 b) at least one fibrous, electrically conductive filler,
  wherein the at least one fibrous, electrically conductive filler is present, at least partly, in a form of a bound fiber network with the at least one metal component such that fibers of the at least one fibrous, electrically conductive filler are present in a form bound to one another by the at least one metal component, and
  further wherein the at least one fibrous, electrically conductive filler comprises aluminum, copper, silver, gold, nickel, mu-metal, alnico, permalloy, ferrite, carbon nanotubes and graphene.

2. The adhesive film according to claim 1, wherein fibers of the at least one fibrous, electrically conductive filler have an aspect ratio of at least 3, wherein the aspect ratio is a ratio between a greatest longitudinal extent and a small longitudinal extent of the fibers.

3. The adhesive film according to claim 2, wherein the aspect ratio of the fibers is at least 10.

4. The adhesive film according to claim 2, wherein fibers of the at least one fibrous, electrically conductive filler have a fiber length from 1 to 10 mm.

5. The adhesive film according to claim 1, wherein at least one of the at least one fibrous, electrically conductive fillers is a carbon modification or a carbon-containing chemical compound.

6. The adhesive film according to claim 5, wherein the at least one fibrous, electrically conductive filler consists of copper-coated carbon fibers or nickel-coated carbon fibers.

7. The adhesive film according to claim 1, wherein the at least one fibrous, electrically conductive filler comprises at least one selected from copper and nickel.

8. The adhesive film according to claim 7, wherein the at least one fibrous, electrically conductive filler consists of coppered aluminum fibers or nickeled aluminum fibers.

9. The adhesive film according to claim 1, wherein the fibers of the at least one fibrous and regions formed by the at least one metal component are aligned in a first direction or orientation.

10. The adhesive film according to claim 9, wherein the first direction or orientation is substantially perpendicular to the plane of the adhesive film.

11. The adhesive film according to claim 1, wherein the at least one metal component is a metal or a metal alloy.

12. The adhesive film according to claim 1, wherein the at least one adhesive, bondable when heat-activated, is a heat-activatable thermoplastic adhesive.

13. The adhesive film according to claim 1 aims, wherein the at least one adhesive, bondable heat-activated, is a heat-activatable reactive adhesive.

14. The adhesive film according to claim 1, wherein fibers of the at least one fibrous, electrically conductive filler have a fiber length between 0.1 and 0.9 mm.

15. The adhesive film according to claim 1, wherein the fibers of the at least one fibrous have a thickness of at least 60 μm and no more than 180 μm.

16. A method for adhesive bonding on a first substrate surface, the method comprising:
 bonding the first substrate by means of the adhesive film according to claim 1, which is heat-activated for bonding on the first substrate.

17. The method according to claim 16, further comprising:
 bonding a surface of the first substrate to a surface of a second substrate by means of the adhesive film that has been heat-activated.

18. The method according to claim 17, wherein
 first of all the adhesive film is subjected to a preliminary fastening onto the surface of the first substrate, by the adhesive film being activated at a temperature below the melting temperature of the metal component; and
 thereafter a final fixing is brought about, by the adhesive film being activated on the surface of the first substrate, or in a final disposition between the surfaces of the first and second substrates, at a temperature above the melting temperature of the metal component.

19. The method according to claim 16, wherein the heat the activation of the adhesive film is performed at a temperature below the melting temperature of the metal component.

20. The method according to claim 16, wherein the adhesive bonding is brought about by means of the adhesive film, which can be bonded when heat-activated, and the filler is oriented by means of a magnetic field before or during the activation.

* * * * *

UNITED STATES PATENT AND TRADEMARK OFFICE
CERTIFICATE OF CORRECTION

PATENT NO. : 9,593,264 B2
APPLICATION NO. : 14/236269
DATED : March 14, 2017
INVENTOR(S) : Keite-Telgenbüscher et al.

It is certified that error appears in the above-identified patent and that said Letters Patent is hereby corrected as shown below:

In the Specification

Column 5, Line 37, "EP1" should read -- [0027] EP1 --.

Signed and Sealed this
Twelfth Day of November, 2019

Andrei Iancu
*Director of the United States Patent and Trademark Office*